(12) United States Patent
Frosien

(10) Patent No.: US 7,675,042 B2
(45) Date of Patent: Mar. 9, 2010

(54) BEAM OPTICAL COMPONENT FOR CHARGED PARTICLE BEAMS

(75) Inventor: Juergen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 482 days.

(21) Appl. No.: 10/578,206

(22) PCT Filed: Nov. 4, 2004

(86) PCT No.: PCT/EP2004/012502

§ 371 (c)(1),
(2), (4) Date: Jan. 15, 2007

(87) PCT Pub. No.: WO2005/043579

PCT Pub. Date: May 12, 2005

(65) Prior Publication Data

US 2007/0125954 A1 Jun. 7, 2007

(30) Foreign Application Priority Data

Nov. 4, 2003 (EP) .................................. 03025353

(51) Int. Cl.
*H01J 29/02* (2006.01)
(52) U.S. Cl. ............................. 250/396 R; 250/396 ML
(58) Field of Classification Search ............. 250/396 R, 250/396 ML
See application file for complete search history.

(56) References Cited

U.S. PATENT DOCUMENTS 2,458,962 A 1/1949 Eric (Continued)

FOREIGN PATENT DOCUMENTS

DE 914532 C 7/1954

(Continued)

OTHER PUBLICATIONS

PCT International Preliminary Report/Written Opinion for PCT/EP2004/012502, dated May 18, 2006.

(Continued)

*Primary Examiner*—Jack I Berman
*Assistant Examiner*—Hanway Chang
(74) *Attorney, Agent, or Firm*—Patterson & Sheridan, LLP

(57) ABSTRACT

The present invention relates to a beam optical component (1, 201) for acting on a charged particle beam (63) including a first element (3; 203) having a first opening (9; 209) for acting on the charged particle beam (63), at least a second element (5; 205) for acting on the charged particle beam (63); at least one distance piece (20a, 20b, 20c) positioned between the first element (3; 203) and the second element (5; 205) to define a minimum distance between the first element (3; 203) and the second element (5; 205); and a first holding piece (30a; 30b; 30c) for abutting the first element (3) to the at least one distance piece (20a, 20b, 20c), whereby the first holding piece (30a; 30b; 30c) is attached to the at least one distance piece (20a, 20b, 20c). First and second elements (3; 203; 5; 205) are preferably electrodes or pole pieces to act on the charged particle beam by an electrostatic or magnetic force. With the first holding piece (30a; 30b; 30c) attached to the at least one distance piece, distorting mechanical forces on the first and second elements (3, 5) are reduced which improves the performance of the respective beam optical components (1; 201).

20 Claims, 10 Drawing Sheets

U.S. PATENT DOCUMENTS

| | | | |
|---|---|---|---|
| 2,507,331 A | | 5/1950 | Henri et al. |
| 2,581,446 A | * | 1/1952 | Robinson ................... 313/250 |
| 3,694,687 A | | 9/1972 | Glenn |
| 4,450,357 A | * | 5/1984 | Tsuno ................. 250/396 ML |
| 6,362,486 B1 | | 3/2002 | Into |
| 2005/0242293 A1 | * | 11/2005 | Benveniste ............. 250/396 R |

FOREIGN PATENT DOCUMENTS

| | | |
|---|---|---|
| GB | 2161019 A | 1/1986 |
| JP | 52126160 | 10/1977 |
| JP | 52126160 A | 10/1977 |
| JP | B-53-4388 | 1/1978 |
| JP | 11086767 | 3/1999 |
| JP | 11086767 A | 3/1999 |
| JP | 2000149842 | 5/2000 |

OTHER PUBLICATIONS

Japanese Office Action, Application No. 2006-537256, dated Dec. 20, 2008.

* cited by examiner

--Prior Art--

BEAM OPTICAL COMPONENT FOR CHARGED PARTICLE BEAMS

FIELD OF THE INVENTION

The invention relates to beam optical components for acting on charged particle beams. In particular, the present invention relates to high precision electrostatic or magnetic lenses, mirrors or spectrometers for charged particle beam devices.

BACKGROUND OF THE INVENTION

Improvements of charged particle beam devices, like electron microscopes or focused ion beam devices (FIB), often depend on improvements of their beam optical components. Beam optical components are, for example, electrostatic or magnetic lenses, deflectors, electrostatic or magnetic mirrors, spectrometers and the like.

Beam optical components that rely on an electrostatic interaction with the charged particle beam are usually composed of two or more electrodes with openings or some other structure thereon. By applying appropriate voltages to the respective electrodes, the geometric shape of the electrodes and the electric potentials generate an electrostatic field that can be used to focus, deflect or disperse an incoming charged particle beam.

Contrastingly, beam optical components that rely on a magnetic interaction with the charged particle beam are composed of two or more pole pieces with openings or some other structure thereon. By applying an appropriate magnetic flux to the respective pole pieces, the geometric shape of the pole pieces and the magnetic flux generate a magnetic field that, similar to an electric field, can be used to focus, deflect or disperse an incoming charged particle beam.

In order to provide a well-defined focussing, deflection or dispersion, it is important that the multiple electrodes or pole pieces are well aligned with respect to each other. For example, for an electrostatic or magnetic lens made of two electrodes or two pole shoes, it is important that the openings of the first electrode or first pole shoes are coaxially aligned with respect to the openings of the second electrode or pole shoes with a precision on a micrometer scale. To achieve this precision usually represents a major challenge.

Further, beam optical components in high-precision charged particle beam devices have to be cleaned on a regular basis in order to perform to their specifications. An effective cleaning, however, requires that the beam optical component has to be disassembled and re-assembled again. Therefore, an beam optical component must comply with a design that allows for a repetitive disassembly and re-assembly without harming the alignment precision.

A method for manufacturing an electrostatic lens with high alignment precision is disclosed by S. Planck and R. Spehr in "*Construction and fabrication of electrostatic field lenses for the SMART project*" in the Annual Report 1996/1997 of "Licht- und Teilchenoptik", Institut für angewandte Physik, Technische Unversität Darmstadt, Prof. Dr. Theo Tschudi on page 114. In this report, it is disclosed that six electrically insulating $Al_2O_3$ spheres between the middle electrode of an Einzel-lens and the two outer electrodes are used as positioning elements to define the positions of the two outer electrodes with respect to the middle electrode. At the same time, the insulating character of the $Al_2O_3$ spheres provides that the middle electrode is electrically insulated from the two outer electrodes in order to be able to apply different voltages to the electrodes.

FIG. 1 schematically illustrates a cross section through the known electrostatic lens 1 by S. Planck, used for high-precision charged particle beam optics. The electrostatic lens 1 comprises a first electrode 3, a second electrode 5, and a third electrode 7, each electrode having respective first, second and third openings 9, 10, 11. First and second electrodes 3, 5 are kept at a first predetermined minimum distance by three equal first spheres 120 which are positioned between the first electrode 3 and the second electrode 4, while second and third electrodes 5, 7 are kept at a second predetermined minimum distance by three equal second spheres 122 between the second electrode 5 and the third electrode 7. Further, three metal screws 100 are used to clamp the three electrodes 3, 5, 7 together.

The high precision of the alignment of the three openings 9, 10, 11 of the electrodes with respect to the optical axis 13 is based on the high geometrical precision by which spheres can be manufactured. For example, it is known to manufacture spheres made of steel or $Al_2O_3$ with a precision that deviates by less than a micrometer from a specified ideal spherical shape. Further, recesses in the electrodes for receiving the spheres provide for an easy and precise repositioning of the spheres during re-assembly of the beam optical component.

However, when tightening the screws during re-assemblage of the beam optical component to clamp the electrodes together, the electrodes often become distorted or tilted with respect to each other, which diminishes the focussing quality of the beam optical component.

Further, as can be seen from FIG. 1, it is difficult to prevent arcing between second electrode 5 and metal screw 100 when high voltages are applied between second electrode 5 and first or third electrode 3, 5, due to the limited size of through-hole 102 in the second electrode. Further, for many applications, it is important to apply different voltages between the two outer (first and third) electrodes. Since screws made of an insulating material usually do not have a stiffness that a metal screw has, metal screws are usually taken for clamping the three electrodes together. With a metal screw clamping the three electrodes together, however, first and third electrode 3, 7 would electrically shorten first and second electrodes when different voltages would be applied.

The electrostatic lens 1 of FIG. 1 is only used as an example for demonstrating the general alignment problems of electrostatic or magnetic beam optical components in charged particle beam devices. Similar alignment problems of two or more electrodes or pole shoes also occur when two or more electrodes or pole shoes of an electrostatic or magnetic mirror or a spectrometer have to be assembled.

SUMMARY OF THE INVENTION

It is therefore a first aspect of the present invention to provide a beam optical component for acting on a charged particle beam which does not show the above mentioned problems.

In particular, it is an aspect of the present invention to provide a beam optical component which ensures a high precision for the alignment of the first electrode or pole piece with respect to the other electrodes or pole pieces of the beam optical component.

Further, it is an aspect of the present invention to provide a beam optical component which can easily be disassembled and re-assembled without reducing the alignment precision of the electrodes after re-assemblage.

It is yet a further aspect of the present invention to provide a beam optical component with electrodes that provide a high dielectric strength to be operable at high voltages.

It is a further aspect of the present invention to provide a charged particle beam device with high precision beam optical components that can be easily disassembled and reassembled on a regular base without deteriorating the focussing capabilities of the device.

These and other advantages are achieved by the beam optical components according to claim 1, and the charged particle beam device according to claim 19.

Further advantages, features, aspects, and details of the invention are evident from the dependent claims, the description and the accompanying drawings. The claims are intended to be understood as a first non-limiting approach of defining the invention in general terms.

The beam optical component for acting on a charged particle beam according to claim 1 comprises a first element having a first opening for acting on the charged particle beam, at least a second element for acting on the charged particle beam, at least one distance piece positioned between the first element and the at least second element to provide for a minimum distance between the first and the second element, and a first holding piece for abutting the first element to the at least one distance piece, whereby the first holding piece is attached to the at least one distance piece.

In a first preferred embodiment of the invention, first and/or second elements are respective first and/or second electrodes. In this case, the beam optical component can act on the charged particle beam by means of an electrostatic field.

In another preferred embodiment of the invention, first and/or second elements are respective first and/or second pole pieces. In this case, the beam optical component can act on the charged particle beam by means of a magnetic field.

In a still further embodiment of the invention, first and/or second elements are both respective first and second pole pieces and first and second electrodes. In this case, the beam optical component can act on the charged particle beam by means of a combined magnetic and electrostatic field like, for example, the combined electrostatic and magnetic focussing lens used to improve focussing quality.

With the first holding piece attached to the at least one distance piece, the first element can be held to the at least one distance piece at the point of mechanical support defined by the position of the at least one distance piece. Therefore, the pressure exerted by the first holding piece onto the first element can be counteracted by the at least one distance piece at the position where the first holding piece exerts its force onto the first element. This eliminates distorting or tilting forces onto the first element which otherwise would deteriorate the quality of focussing, deflecting or dispersing the charged particle beam.

Further, the first holding pieces attached to the at least one distance piece eliminates the need for a metal screw that is directly connected with the first and the second element to clamp the two elements together. As a consequence, if first and second elements are electrodes, a short circuit between the first and second element represented by the metal screw is eliminated. This ensures that the first and second electrodes of the beam optical component can be operated at different voltages, even if the screw is made of a conducting material.

Preferably, the beam optical component also includes a second holding piece for abutting the second element to the at least one distance piece. Preferably, the second holding piece is attached to the at least one distance piece as well. This way, the at least one distance piece can be repeatably disassembled from, and re-assembled to, the first and second element. Easy disassemblage and re-assemblage facilitates a convenient cleaning of each component of the beam optical component on a regular base.

In one preferred embodiment of the invention, the at least one second element has a first structured portion to be aligned to the first opening. The structured portion may be used to define the functionality of beam optical component on the charged particle beam. For example, if first and second elements are electrodes, the beam optical component can be made to act on the charged particle beam as a flat mirror if the structured portion of the first element is shaped to be coplanar with respect to the first opening; further, if the structured portion of the at least second elements is a concave depression into the second element's body, the beam optical component can be made to act on the charged particle beam as a focussing beam optical component; further, if the structured portion of the at least second elements is a convex structure projecting from the element's body, the beam optical component can be made to act on the charged particle beam as a defocussing beam optical component, further, the structured portions of the second element may have shapes that are suited to correct aberrations, astigmatism and other defects of a charged particle beam.

In another preferred embodiment, the first structured portion of the second element comprises a second opening to act on the charged particle beam. In this case, if the first opening of the first element and the second opening of the second element are coaxially aligned, the beam optical component can act on a charged particle beam as a focussing electrostatic or magnetic lens.

Preferably, the beam optical component according to the invention also includes a third element. In this case, more refined operations can be carried out with the beam optical component. For example, if first, second and third element of the beam optical component are electrodes that each comprise an opening, the beam optical component can be made to operate as an Einzel-lens with the two outer electrodes being having the same potential to minimize interference with the electric potential outside of the beam optical component.

Further, with first, second and third elements, the distance pieces and holding pieces according to the invention eliminate the need for metal screws to clamp the first, second and third elements together. This way, if first, second and third elements are respective first, second and third electrodes, the maximum allowable voltage of the beam optical component is not limited by possible electric field peaks in the region of a clamping metal screw. Rather, in this case, the maximum allowable voltage for the beam optical component is only limited by the size of the distance pieces and the minimum distance between adjacent electrodes. As a consequence, the dielectric field strength can easily be increased. For example, with two adjacent electrodes being at a minimum distance of 10 mm apart, voltages of up to typically 10 to 12 kV can, in principle, be applied in vacuum between the adjacent electrodes. High-voltage performance is important for beam optical components that have to focus charged particle beams with a high beam energy. For example, for many applications, electron beam device use a beam energy of a few hundred keV or more.

In another preferred embodiment of the invention, the second structured portion of the third element may include a third opening. This way, if the first, second and third openings are openings of said electrodes that are coaxially aligned with respect to each other, the beam optical component can be used as Einzel-lens where, during operation, first and third electrode are provided with the same voltage.

Preferably, the at least one distance piece and/or the further at least one distance pieces are each three distance pieces. Since three points are a minimum to define a plane, it is a more convenient and more precise method to define a minimum distance between adjacent electrodes by three separate distance pieces, rather by one, two or more than three.

Preferably, at least one of the distance pieces is a spherically shaped, since spherically shaped bodies can be manufactured to a high geometrical precision and since a sphere defines the same distance between two electrodes independent of the orientation of the spherically shaped body. Further, a spherically shaped body as a distance piece not only provides for a minimum distance between two adjacent electrodes, but also provides for a lateral fixation of two adjacent electrodes with respect to each other if the spherically shaped bodies are partially sunk into the appropriate recess within the respective electrodes.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

The term "beam optical component" in claim 1 preferably refers to electrostatic or magnetic lenses, electrostatic or magnetic mirrors, electrostatic or magnetic deflectors, electrostatic or magnetic and other components that act on a charged particle beam by means of electrostatic and/or magnetic fields. Beam optical components according to the invention may be used in charged particle beam devices like a charged particle beam microscope to probe a specimen, e.g. a scanning electron microscope (SEM), a transmission electron microscope (TEM), a scanning transmission microscope (STEM), or a device that uses the charged particle beams to structure a specimen like, e.g. an electron beam pattern generators used to structure a lithographic mask, or a focused ion beam device (FIB) to slice or mill a specimen.

Figure 1:
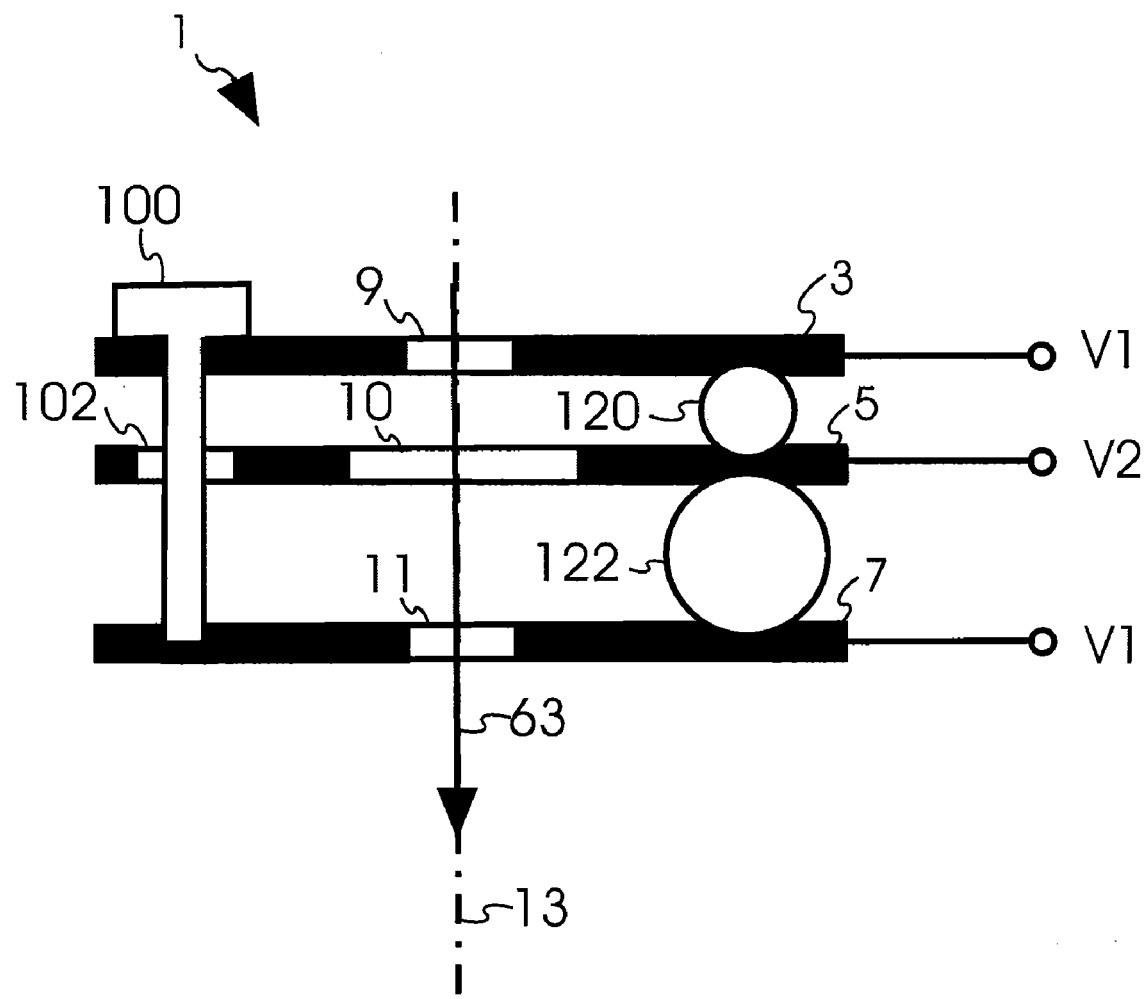
FIG. 1 Prior art Einzel-lens system with spheres and metal screws for defining the positions of the electrodes of the Einzel-lens system FIGS. 2a-2b Focussing beam optical component according to the invention with two electrodes (electrostatic lens).
Figure 2A:
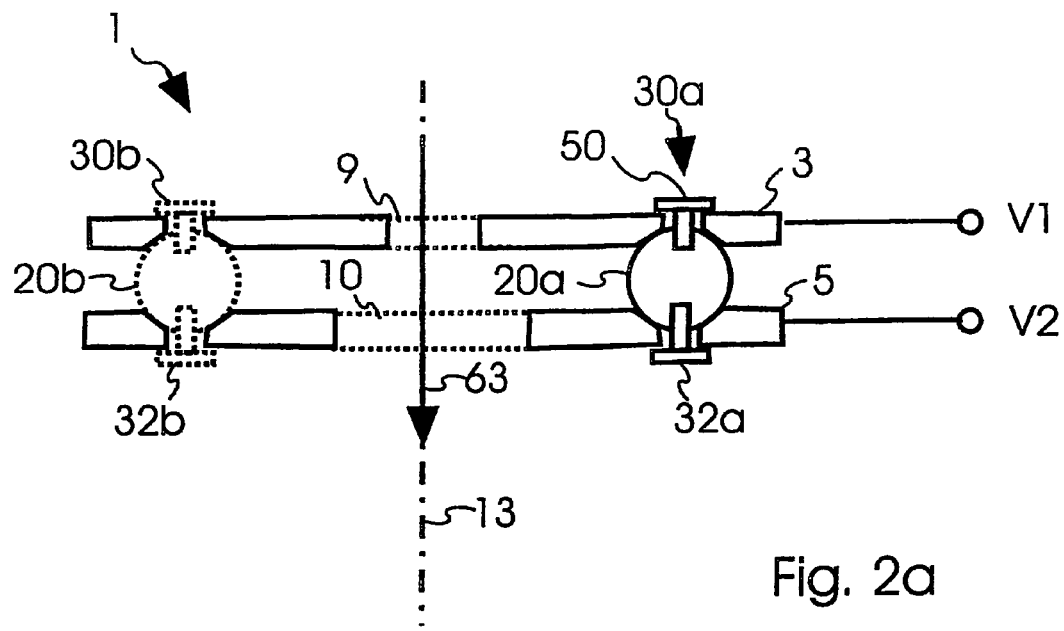
FIG. 2c Detailed view on a holding piece of the focussing beam optical component of FIG. 2a-2b FIGS. 3a-3b Focussing beam optical component according to the invention with three electrodes (electrostatic lens).
Figure 2B:
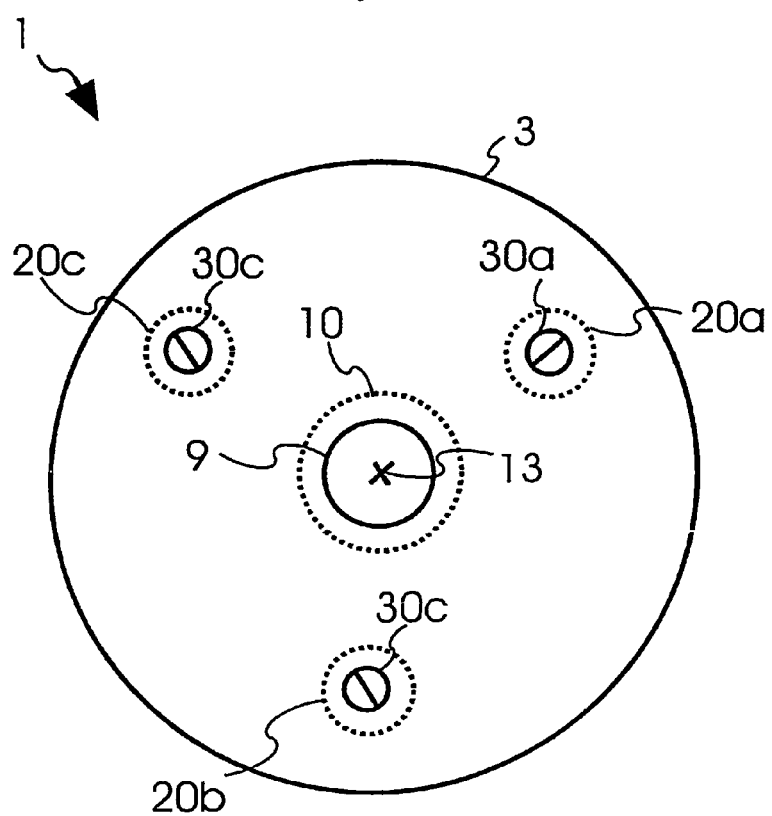

FIG. 2a depicts schematically a cross section through the center of a first beam optical component 1 according to the invention. In this embodiment, the beam optical component is an electrostatic lens 1 to focus a charged particle beam 63. FIG. 2b depicts a front view on the same electrostatic lens 1 in the direction of the optical axis. In this case, the first and second elements are first and second electrodes 3, 5.

The electrostatic lens 1 of FIGS. 2a-2b is comprised of two electrodes, i.e. first electrode 3 and second electrode 5, having each a respective first or second opening 9, 10 which are coaxially aligned with respect to each other. For a precise focussing, it is preferred that the precision of the coaxial alignment of first and second openings 9, 10 with respect to each other is better than 100 µm, preferably better than 10 µm, and even more preferred, better than 2 µm.

Electrostatic lens 1 of FIGS. 2a-2b can be used, e.g., as immersion lens where the first voltage V1 of the first electrode 3 and the second voltage V2 of the second electrode 5 form a rotationally symmetric electric field around optical axis 13. The elements in FIGS. 2a-2b drawn with dotted lines refer to elements that are covered by another structure of the beam optical component 1, or which are not part of the cross section plane First and second electrodes 3, 5 of FIGS. 2a-2b are rotationally symmetric shaped plates made of a conducting material, e.g. stainless steel, each having respective first and second openings 9, 10. First and second openings 9, 10 of the electrode 9, 10 are coaxially aligned with respect to the optical axis 13 with a precision of better than 100 µm, and preferably of better than 5 µm. For best focussing (or defocussing) results, charged particle beams pass along the optical axis 13 through openings 9, 10.

First and second electrodes 3, 5 are kept at a minimum distance by three distance pieces (first distance piece 20a, second distance piece 20b, and third distance piece 20c) between first and second electrodes 3, 5. The three distance pieces 20a, 20b, 20c are made of an insulating material, e.g. $Al_2O_3$, in order to electrically insulate first electrode 3 at a first voltage V1 from second electrode 5 at a different second voltage V2. Preferably, the three distance pieces 20a, 20b, 20c are of same shape and size in order to provide for the same distance between first and second electrodes 3, 5 at three different positions. This way, the two electrodes 3, 5 can be aligned in parallel.

Preferably, the three distance pieces 20a, 20b, 20c are spherically shaped bodies. In order to provide a high degree of parallelism between first and second electrodes 3, 5, the diameters of the three spherically shaped bodies differ from each other by less than 1/1000 and, even more preferred, by less than 1/10000. For example, if the diameter of the sphere in FIG. 2a is nominally 10 mm, it is preferred that the diameters of the spheres deviate by less than 10 µm, and, even more preferred, by less than 1 µm from the nominal diameter. The fabrication of spheres made of $Al_2O_3$, steel or other ceramic materials with such high geometric precision is well known in the art.

Figure 2C:
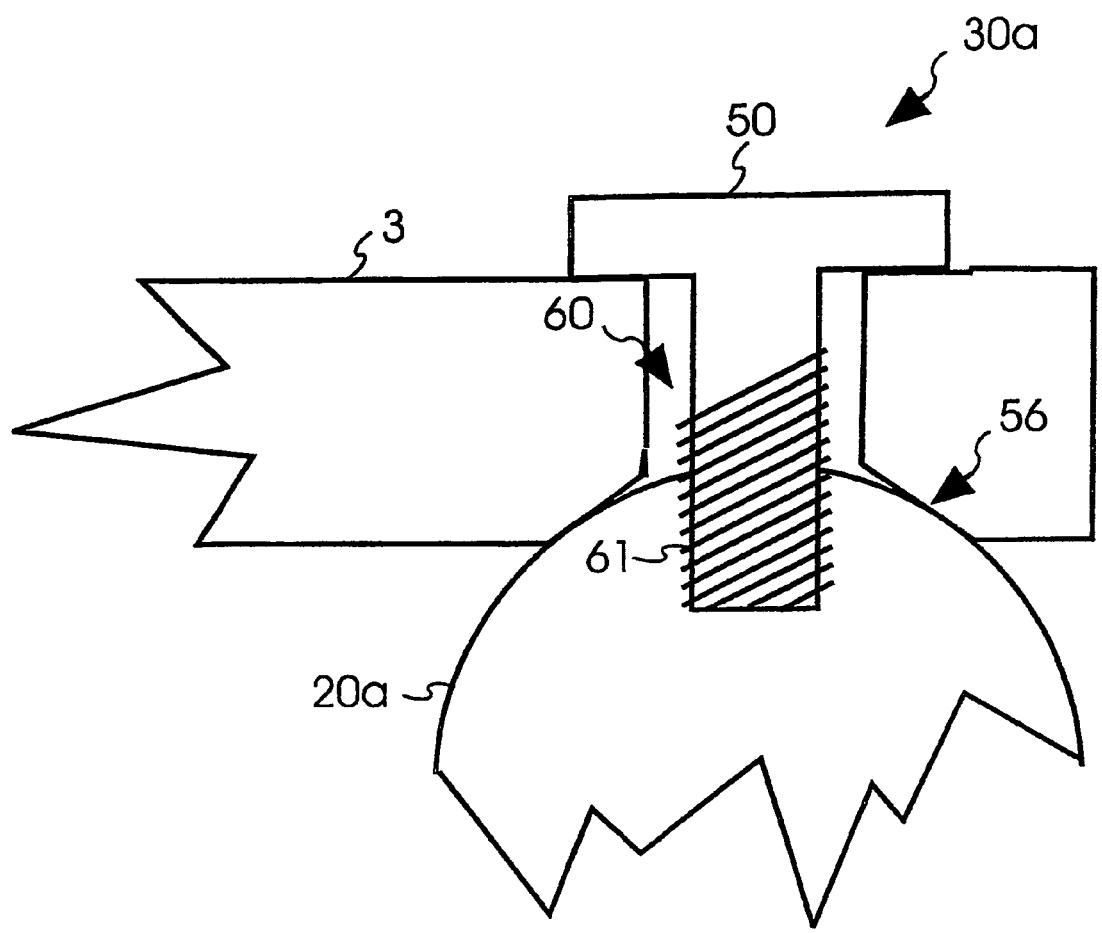

FIGS. 2a-2b also schematically depict, for each distance element 20a, 20b, 20c, first holding pieces 30a, 30b, 30c and second holding pieces 32a, 32b, 32c, that each are attached to the respective distance elements 20a, 20b, 20c to abut the first electrode 3 and the second electrode 5 to the distance elements 20a, 20b, 20c. There are many ways by which first holding pieces 30a, 30b, 30c and second holding pieces 32a, 32b, 32c can be attached to the respective distance piece. In FIG. 2a-2c, first and second holding pieces 30a, 30b, 30c, 32a, 32b, 32c are holding screws 50 that are screwed through through-holes 60 of the first or second electrode 3, 5 into the respective distance elements 20a, 20b, 20c. This way, the holding screws 50 are attached to the respective distance elements 20a, 20b, 20c, while the bolt head of holding screw 50 can exert a pressure onto the respective electrode 3, 5 to abut the electrode to the respective distance element 20a, 20b, 20c. Moreover, the pressure by which an electrode is abutted to a distance piece can be adjusted by the number of turns by which holding screw 50 is screwed into the respective distance piece.

FIG. 2c schematically depicts a more detailed view on one of the first holding piece 30a of FIGS. 2a-2b, to illustrate the way by which holding piece 30a abuts first electrode 3 to the at least one spherically shaped distance piece 20a. In FIG. 2c, first holding piece 30a includes a holding screw 50 which is fed through through-hole 60 of the first electrode 3 and screwed into respective spherically shaped distance piece 20a. This way, holding screw 50 is securely attached to the spherically shaped distance piece 20a by means of screw thread 61, while the bolt head of holding screw 50 exerts it pressure onto first electrode 3 in the opposite direction to abut electrode 3 to distance piece 20a.

It should be noted that there are several ways by which holding screw 50 can be attached to distance pieces 20a, 20b, 20c. For example, it may provide for a better stability if the distance pieces have threaded metallic inserts glued or brazed into the distance piece, in which the holding screws can be screwed in. This way, a holding screw can be turned into the distance piece several times without damaging distance element 20a by the thread of the holding screw. Further, while FIG. 2c relates to holding piece abutting an electrode to a distance piece, it should be noted that the description below also applies to the case where, instead of an electrode, a pole piece is abutted to a distance piece (see also FIG. 12b).

As can be seen in FIG. 2c, the diameter of through-hole 60 is larger than the diameter of holding screw 50 to leave clearance for holding screw 50 within through-hole 60. The clearance ensures that respective spherically shaped distance piece 20a has enough space to fall into recess 56 of electrode 3 when pressure is exerted by the bolt head of holding screw 50 onto first electrode 3. This way, the lateral positioning of the first and second electrodes 3, 5 with respect to each other is determined by the position of recess 56 and position and size of the spherically shaped distance piece 20a, and not by the position of through-hole 60. With the spherically shaped distance piece 20a partially sunk into recess 56 of first electrode 3, the position of the first electrode 3 with respect to second electrode 5 is fixed in a lateral direction as well as in the direction of the optical axis 13.

Preferably, electrode recesses 56 for holding respective spherically shaped distance pieces 20a, 20b, 20c of a beam optical component 1 are shaped by positioning at least three spheres of the same size as the respective spherically shaped distance pieces between the two adjacent electrodes 3, 5, and clamping the electrodes by an external force together. If the clamping pressure is large enough, the spheres imprint recesses 56 into the first and second electrodes that can be used by the respective spherically shaped distance pieces 20a, 20b, 20c for aligning the two electrodes to each other. As a result, because of the three-point centering made possible by the at least three recesses 56, the two electrodes 3, 5 can be separated and re-assembled with high precision. Preferably, the spheres for creating recesses 56 are made of steel which is hard enough to withstand the clamping pressure.

Further, preferably, the machining of the openings 9, 10 of the first and second electrodes 3, 5 is performed in an assembled set-up, i.e. when the electrodes are aligned by their respective spherically shaped distance pieces 20a, 20b, 20c. This guaranties that the openings 9, 10, 11 are aligned to a common optical axis 13. Further, with the recesses 56, the electrodes 3, 5 can be disassembled and reassembled easily to the same precision. The methods for producing the recesses 56 and the alignment of the openings in the electrodes can of course also be applied to beam optical components that have more than two electrodes.

Figure 3A:
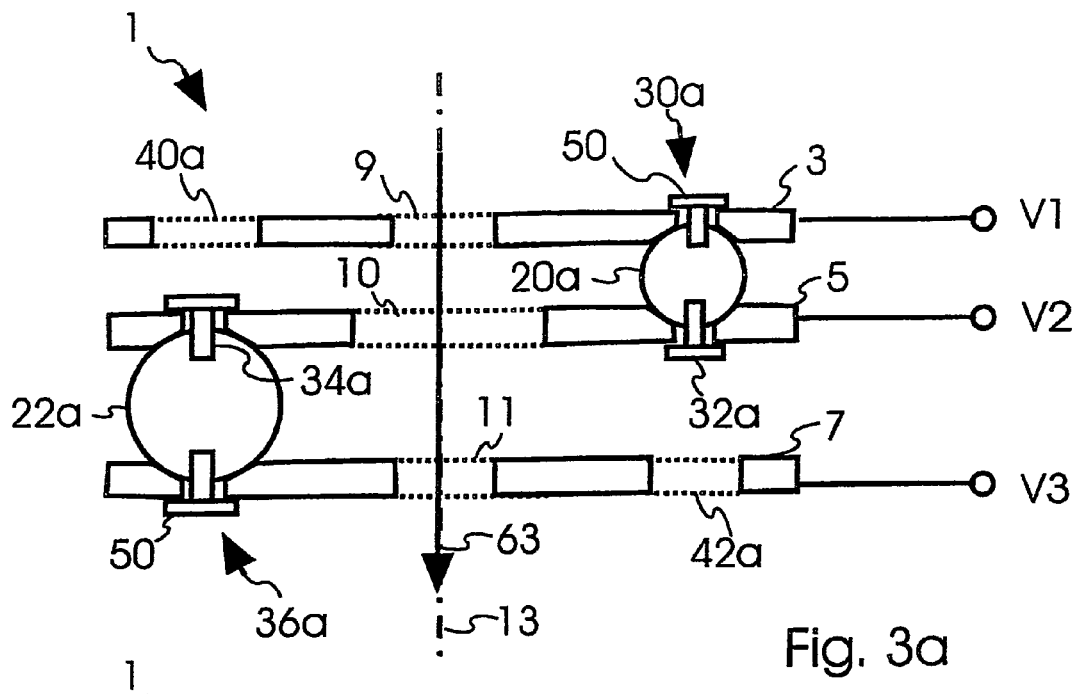
Figure 3B:
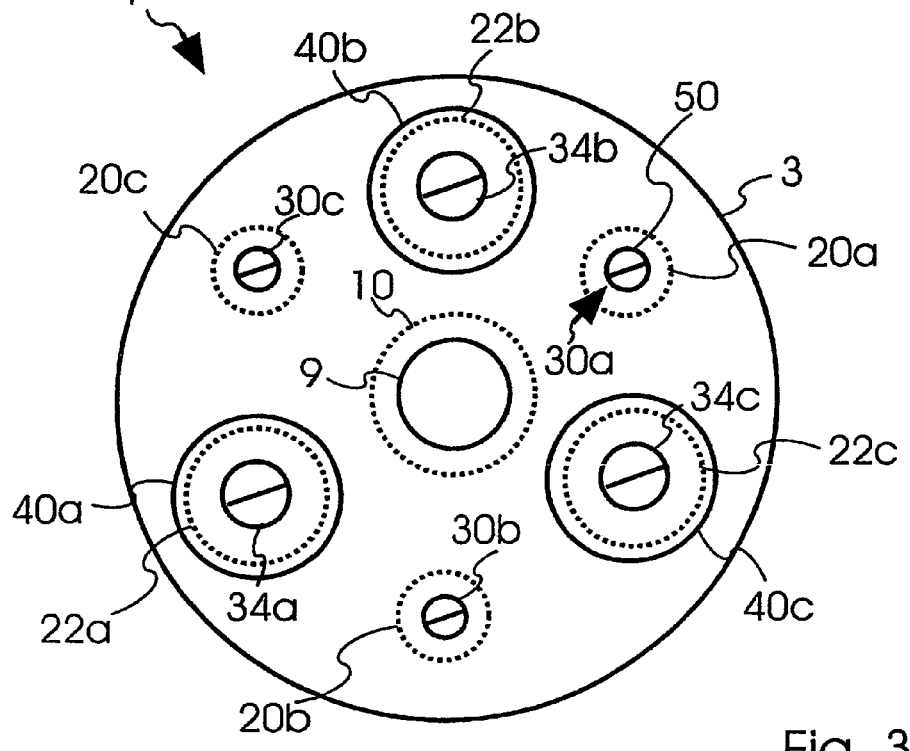

FIG. 3a schematically depicts a cross section through the center of a beam optical component 1 according to the invention which, again, is an electrostatic lens 1. Electrostatic lens 1 has three electrodes, i.e. first electrode 3, second electrode 5, and third electrode 7 having respective first, second and third openings 9, 10, 11. FIG. 3b depicts the electrostatic lens 1 of FIG. 3a as a front view in the direction of the optical axis 13. Such electrostatic lens 1 can be used e.g. as Einzel-lens where the first voltage V1 of the first electrode 3 and the third voltage V3 of the third electrode 7 are the same. However, without a clamping metal screws to directly clamp the first electrode 3 with the third electrode 7, electrostatic lens 1 of FIG. 3a-3b can also be used for applications where the first voltage V1 and the third voltage V3 are different.

As can be seen from FIG. 3a-3b, first, second and third electrodes 3, 5, 7 each comprise first, second and third openings 9, 10, 11, respectively, which are coaxially aligned with respect to the optical axis 13. The sizes of the first, second and third openings 9, 10, 11 may be the same or may be different, depending on the applications which may require different focussing lengths, beam energies, etc. Like in the design of FIG. 2a-2b, first and second electrodes 3, 5 are kept at a minimum distance by three equally sized spherically shaped distance pieces 20a, 20b, 20c, while second and third electrodes 5, 7 are kept at a minimum distance by the three equally sized spherically shaped distance pieces 22a, 22b, 22c. The minimum distances between adjacent electrode 3, 5, 7 are defined by the diameters of the respective spheres, which preferably are defined with a precision of less than a few micrometers.

It should be noted that in FIGS. 3a-3b, first, second and third electrodes 3, 5, 7 are essentially flat. In this case, the minimum distance between adjacent electrodes is essentially the same as the diameters of the respective spherical distance pieces 20a, 20b, 20c, 22a, 22b,22c. However, the electrodes can also have a non-planar shape, e.g. a conical shape. In this case the minimum distance between adjacent electrodes may be considerably larger or considerably smaller that the distance between electrodes at the position of the distance elements (see e.g. FIG. 12b).

Like in FIGS. 2a-2b, it is preferred that the three spherically shaped distance elements 20a, 20b, 20c are positioned between first electrode 3 and second electrode 5 at equal distances to provide for a good parallelism between the two electrodes. Similarly, it is preferred that the three spherically shaped distance elements 22a, 22b, 22c are positioned between second electrode 5 and third electrode 7 at equal distances. Further, in order to avoid spatial interference between the second holding pieces 32a, 32b, 32c of the spherically shaped distance pieces 20a, 20b, 20c with the third holding pieces 34a, 34b, 34c of the further spherically shaped distance pieces 22a, 22b, 22c, the "triangle" formed by the three spherically shaped distance pieces 20a, 20b, 20c is "rotated" with respect to the "triangle" formed by the three further spherically shaped distance pieces 22a, 22b, 22c (see FIG. 3b), preferably by more than 40 degrees and less than 80 degrees.

First holding pieces 30a, 30b, 30c for abutting first electrode 3 to the respective spherically shaped distance pieces 20a, 20b, 20c, second holding pieces 32a, 32b, 32c for abutting second electrode 5 to the respective spherically shaped distance pieces 20a, 20b, 20c, third holding pieces 34a, 34b, 34c for abutting second electrode 5 to the respective spherically shaped further distance pieces 22a, 22b, 22c, and fourth holding pieces 36a, 36b, 36c for abutting third electrode 7 to the respective spherically shaped further distance pieces 22a, 22b, 22c may be the same compared to what was described in FIGS. 2a-2c. In this case, first, second, third and fourth holding pieces are holding screws 50, which, through throughholes 60 of an electrode, are screwed into the respective spherically shaped distance pieces.

FIGS. 3a-3b also disclose three access holes 40a, 40b, 40c in the first electrode 3 for providing access to third holding pieces 34a, 34b, 34c when the beam optical component is assembled. Without access holes 40a, 40b, 40c, holding pieces 34a, 34b, 34c would be covered by first electrode 3. Access to the holding pieces is important to assemble or disassemble the beam optical component. For example, if the holding pieces are holding screws 50, access holes 40a, 40b, 40c would allow for an access to the holding screws 50 with a screwdriver to tighten or loosen the screws for assembly or disassembly. For the same reasons, third electrode 7 also comprises three access holes 42a, 42b, 42c for providing access to second holding pieces 32a, 32b, 32c which otherwise would be covered by the third electrode 7. It should be noted here that access holes 40a, 40b, 40c, 42a, 42b, 42c in the respective electrodes 3, 5, 7 can be avoided by using open recesses 55a or recess bags 55b as described later in FIGS. 10a-10c and FIG. 11.

Figure 4:
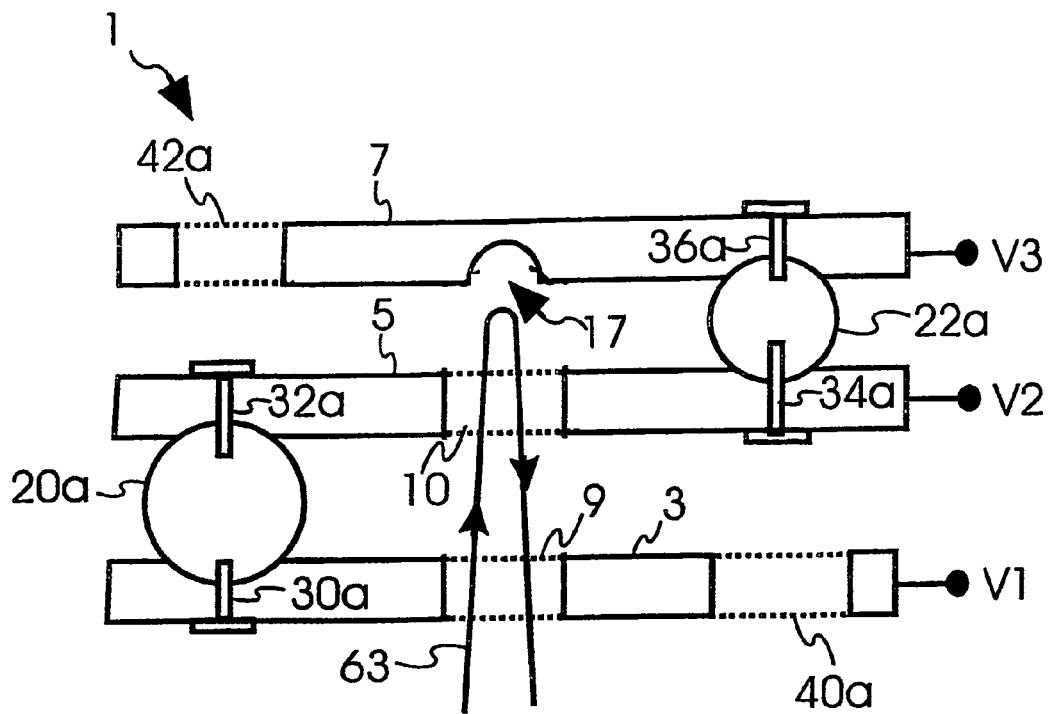
FIG. 4 Reflecting beam optical component according to the invention with three electrodes (mirror).

FIG. 4 discloses a further beam optical component according to the invention used to act as a focussing mirror 1 for a charged particle beam 63. In this case, the beam optical component 1 comprises a first electrode 3 with first opening 9 at a first voltage V1, a second electrode 5 with a second opening 10 at a second voltage V2, and a third electrode 7 having a third voltage V3 to reflect the charged particle beam 63. Third electrode 7, in addition, comprises a structured portion 17 which has a shape of a concave depression to focus the reflected charged particle beam. It should be mentioned that a mirror can also be made from only two electrodes, instead of the three shown in FIG. 4.

The shape of structured portion 17 can be modeled in many ways depending on the application. The spherical depression 17 of FIG. 4 is only an example of many other possibilities. For example, if structured portion 17 of third electrode 7 is a flat surface coplanar to second electrode, beam optical component 1 can be made to act on charged particle beam 63 as a flat mirror. In this case, distance pieces 22a, 22b, 22c are mainly used to provide for minimum distance between the second and third electrodes. If structured portion 17 of third electrode 7 is a spherical structure projecting from the electrode, beam optical component 1 can be made to act on charged particle beam 63 as a defocussing beam optical component. Also, the structured portion 17 of third electrode 7 may have an aspherical shape to correct for aberrations, astigmatism and other beam optical effects that a charged particle beam may experience. Generally, the design of electrostatic focussing mirrors is known in the art so that a person skilled in the art will know what shape the structured portion should have for any given application.

Independent of the shape of structured portion 17, electrostatic mirrors are also faced with the problems (a) of coaxially aligning structured portion 17 to first opening 9 of first electrode 3 with a high precision, (b) of providing a sufficient dielectric strength if the voltage differences between the first, second and/or third electrodes 3, 5, 7 are large, and (c) of providing for an easy disassemblage and reassemblage of beam optical component 1 for cleaning. To solve these problems, distance pieces 20a, 20b, 20c are used to place them between first and second electrodes 3, 5 at their respective recesses 56 (see FIG. 2c), distance pieces 22a, 22b, 22c are used to place them between second and third electrodes 5, 7 at their respective recesses 56, and respective holding pieces 30a, 30b, 30c, 32a, 32b, 32c, 34a, 34b, 34c, 36a, 36b, 36c are used to hold the electrodes to their respective distance pieces. More details to the mechanical mirror design of FIG. 4 can be seen from the description of the electrostatic lens 1 of FIG. 3a-3b, since, from the mechanical point of view, the mirror of FIG. 5 differs from the electrostatic lens of FIG. 3a-b essentially only by the replacement of a third electrode with a hole (see FIG. 3a-3b) by a third electrode with a spherical depression 17 (see FIG. 4).

Figure 5:
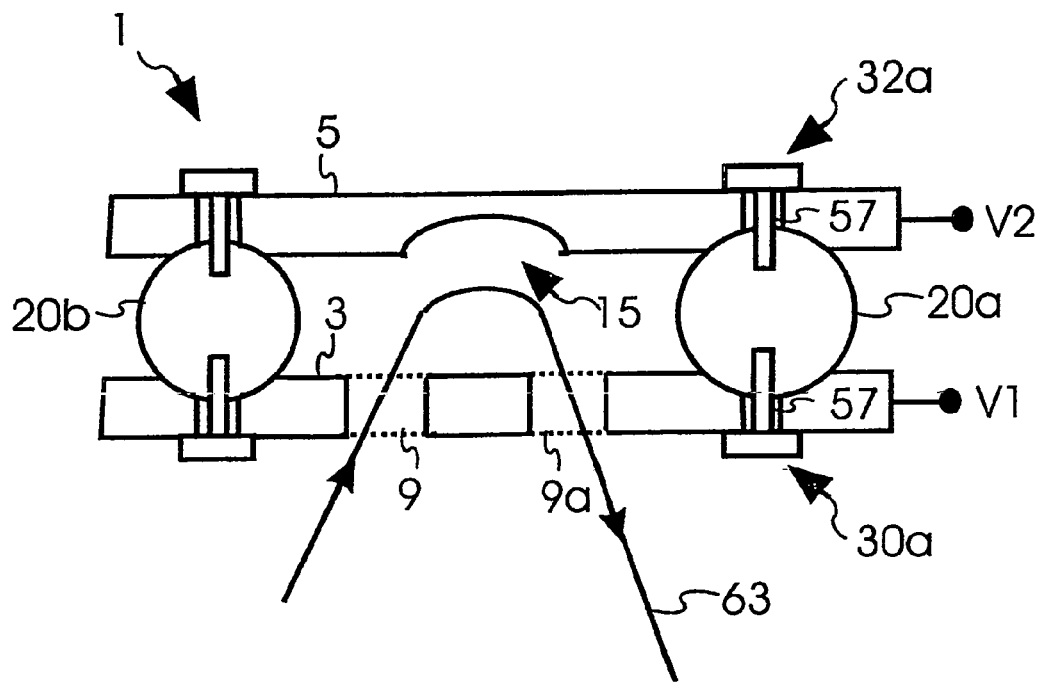
FIG. 5 Dispersing beam optical component according to the invention with two electrodes (spectrometer).

FIG. 5 discloses a further beam optical component according to the invention used to act as a spectrometer for a charged particle beam 63. Spectrometer 1 of FIG. 4 comprises a first electrode having a first opening 9 as an entrance for the charged particle beam 63, a further first opening 9a as an exit for the charged particle beam, and a second electrode 5 having a first structured portion 15 to disperse the charged particle beam 63 according to the energy distribution of the charged particle beam. Again, like in FIG. 4, structured portion 15 in FIG. 4 may be flat or a spherical or aspherical depression within second electrode 5. Further, structured portion needs to be coaxially aligned with respect to first opening 9 and the further first opening 9a to a high precision in order to disperse the charged particle beam 63 according to a required specification. This, like in FIGS. 2a-2b, is achieved by positioning first and second electrodes 3, 5 by means of the distance pieces 20a, 20b, 20c between first electrode 3 and second electrode 5, and by mounting the respective holding pieces 30a, 30b, 30c, 32a, 32b, 32c to hold the two electrodes to their respective distance pieces. More details to the spectrometer of FIG. 5 can be seen from the description of the electrostatic lens 1 of FIG. 2a-2b, since from the mechanical point of view, the spectrometer of FIG. 5 differs from the electrostatic lens of FIGS. 2a-b mainly by a replacement of the second element having a hole (see FIG. 2a-2b) by the second electrode having a rounded recess 15 (see FIG. 5).

FIGS. 6 to 11 disclose beam optical components which differ mainly by the holding pieces and the way in which the holding pieces are attached to the respective distance pieces. It should be mentioned in this context that the invention does not depend on the mechanism by which the holding pieces are attached to the respective distance piece. The attachment may be carried out by screwing, gluing, brazing or any other method that is appropriate to fasten a holding piece directly to a respective distance piece. Further, it is obvious that various attachment methods may be interchangeably used within the same beam optical component. Further, a person skilled in the art would know what attachment method to use for each specific case.

Figure 6:
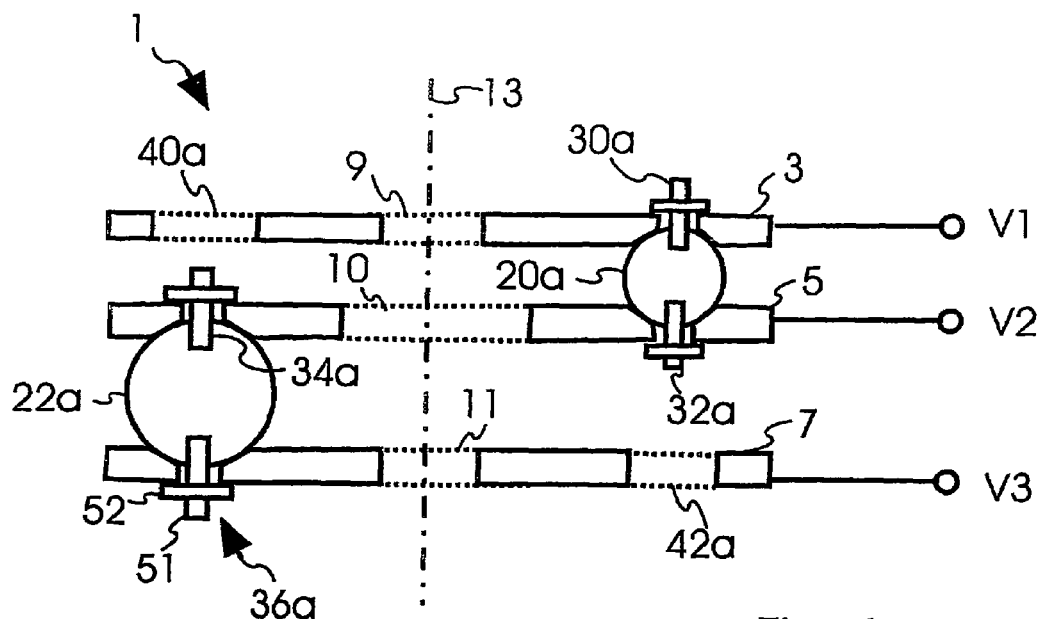
FIG. 6 Electrostatic lens according to the invention with three electrodes using holding pieces that each include a setscrew and a nut.

FIG. 6 shows the beam optical component 1 of FIGS. 3a-3b with the difference that the holding pieces of the device, instead of being screws, are setscrews 51 which are screwed into the respective distance elements. Further in FIG. 6, nuts 52 screwed onto the respective setscrews 51 are used to provide a pressure onto the respective electrodes 3, 5, 7 to abut the electrode to the respective distance pieces. The pressure for abutting the electrodes 3, 5, 7 to the respective distance pieces 20a, 20b, 20c, 22a, 22b, 22c can be adjusted by the number of turns of nut 52 on setscrew 51. The holding pieces of FIG. 6 have an advantage in that the respective setscrews 51 can permanently stay within the respective distance pieces, since only nut 52 has to be removed when removing the respective electrodes for disassembly of the beam optical component. This way, setscrews 51 can be glued or brazed into the holes of the distance pieces which improves the attachment strength, compared to screwing alone.

Figure 7:
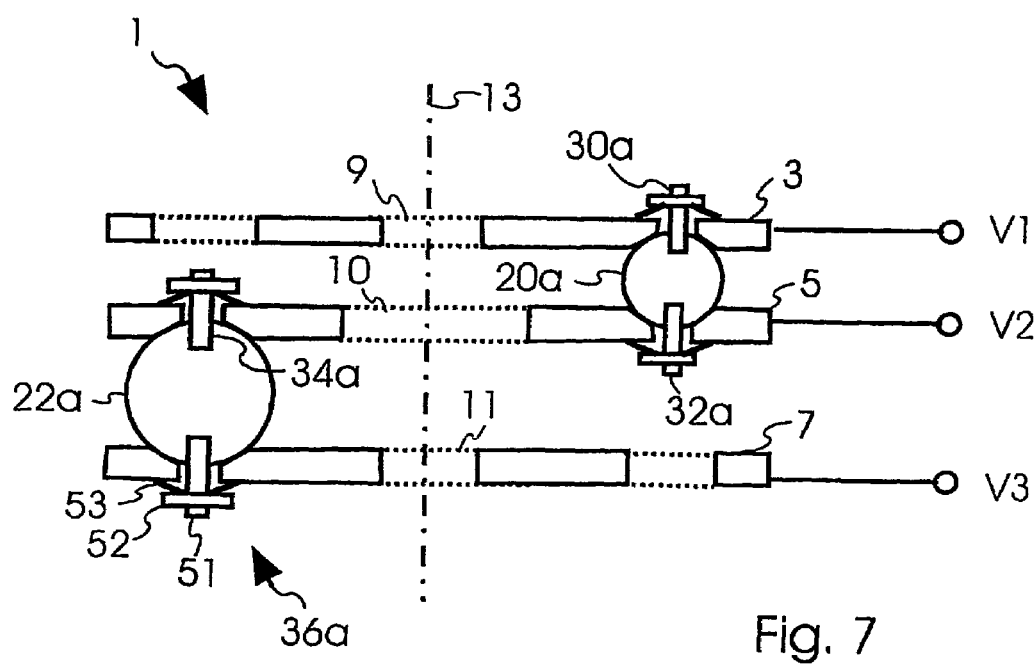
FIG. 7 Electrostatic lens according to the invention with three electrodes using holding pieces that each include a setscrew, a nut and a spring.

A further improvement of the present invention is disclosed in FIG. 7 where springs 53 between nuts 52 and the respective electrodes are used to exert a pressure onto the electrodes. Since the pressure exerted by the springs onto the respective electrodes depends mostly on the type of spring, rather than on the turns of a nut, the pressure of each holding piece onto a given electrode is almost the same. This further reduces misalignments between adjacent electrodes. Preferably, each holding piece of the beam optical component comprises a spring in order to apply a well determined pressure onto all respective electrodes.

Figure 8:
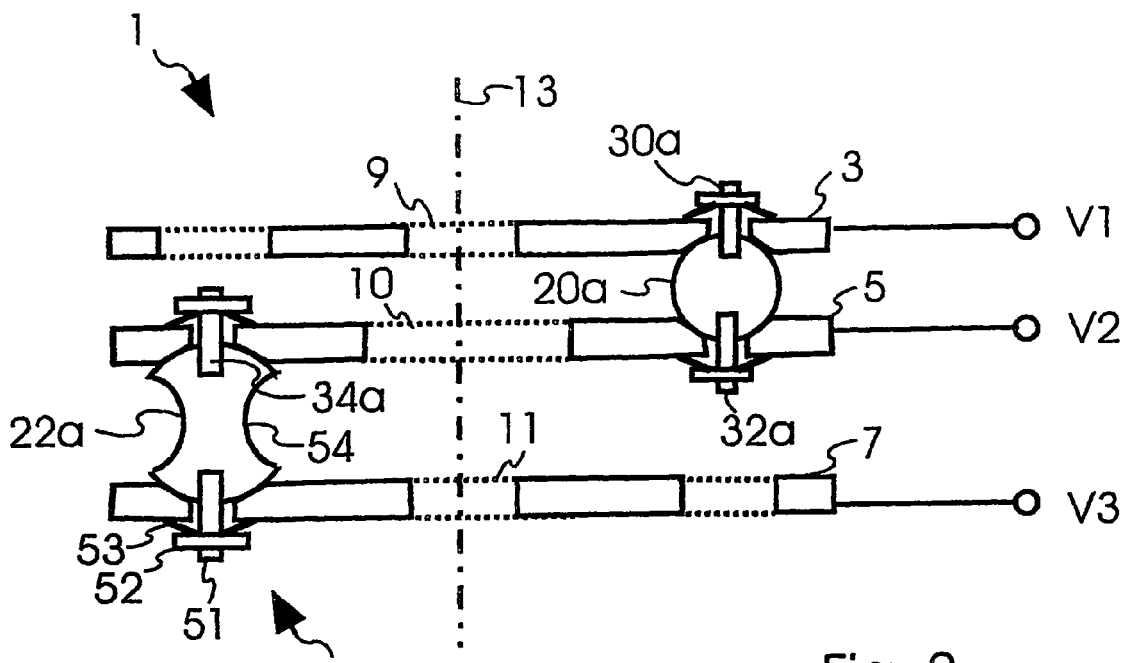
FIG. 8 Electrostatic lens according to the invention with a distance piece made of a "waisted" sphere.

A still further improvement of the present invention is disclosed in FIG. 8. In FIG. 8, the spherically shaped distance pieces 22a, 22b, 22c exhibit a waist 54 in order to limit the lateral extension of the respective-spherically shaped distance piece. A waisted sphere may be the solution to the problem that arises when the minimum distance between adjacent electrodes is so large that the corresponding large diameters of the spherically shaped distance pieces would interfere with the charged particle beam which passes through the openings 9, 10, 11.

The term "waist" is to be understood in a broad sense. It refers to any shape where the lateral extension of a spherically shaped body has been reduced. With a waisted spherically shaped distance piece, it is possible to profit from the advantages of a spherical shape for defining the alignment between adjacent electrodes, while minimizing the lateral extension of the distance piece. For example, the waist may have a shape as if being comprised of more than one waist. A multiple waisted sphere has the advantage that the path from one electrode to an adjacent electrode along the surface of a waisted sphere can be made longer than with only one waist. This effect is well known in the art to improve the dielectric strength between two electrodes.

Figure 9:
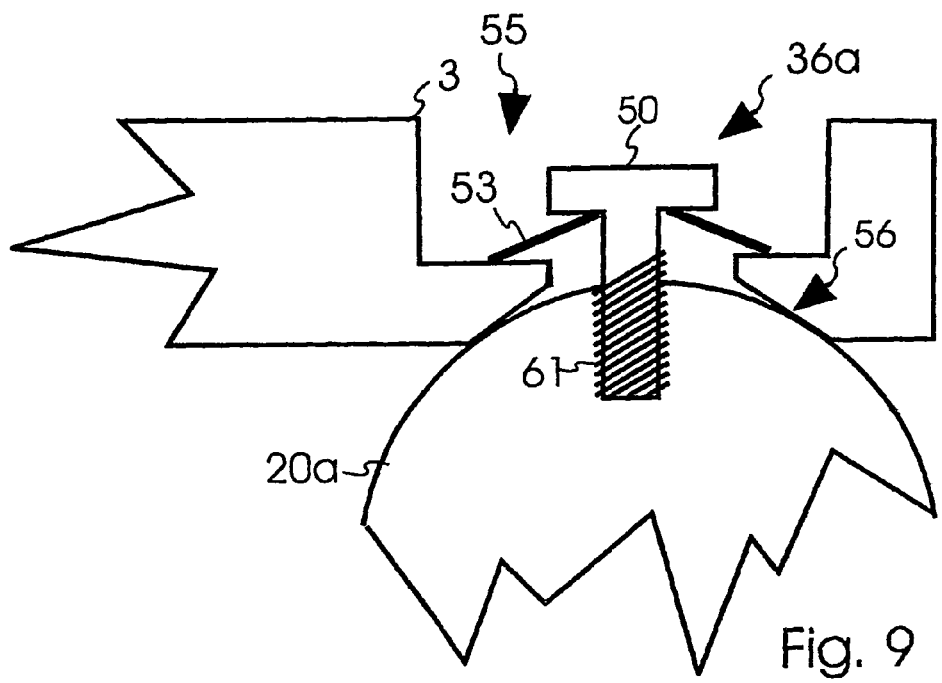
FIG. 9 Detail of the beam optical component according to the invention illustrating a holding piece sunk into a recess of an electrode.

A further improvement of the present invention is disclosed in FIG. 9. In FIG. 9, a recess 55 is introduced into first electrode 3 in order to sink the bolt head of holding screw 50 below the upper surface of electrode 3. Without sinking the bolt head of the holding screw, the bolt head may come too close to an adjacent electrode which may easily create arcing when the voltages are applied between the two electrodes. Therefore, sinking the bolt head of the holding screws 50 improves the dielectric strength between adjacent electrodes which enables the beam optical component for use in high energy beam applications. Again, while FIG. 9 shows the sunken holding screw 50 within recess 55 of electrode 3 screwed into spherically shaped distance piece 20a, the method of sinking a holding piece into an electrode applies also to any other electrode and distance piece of the beam optical component.

Figure 10A:
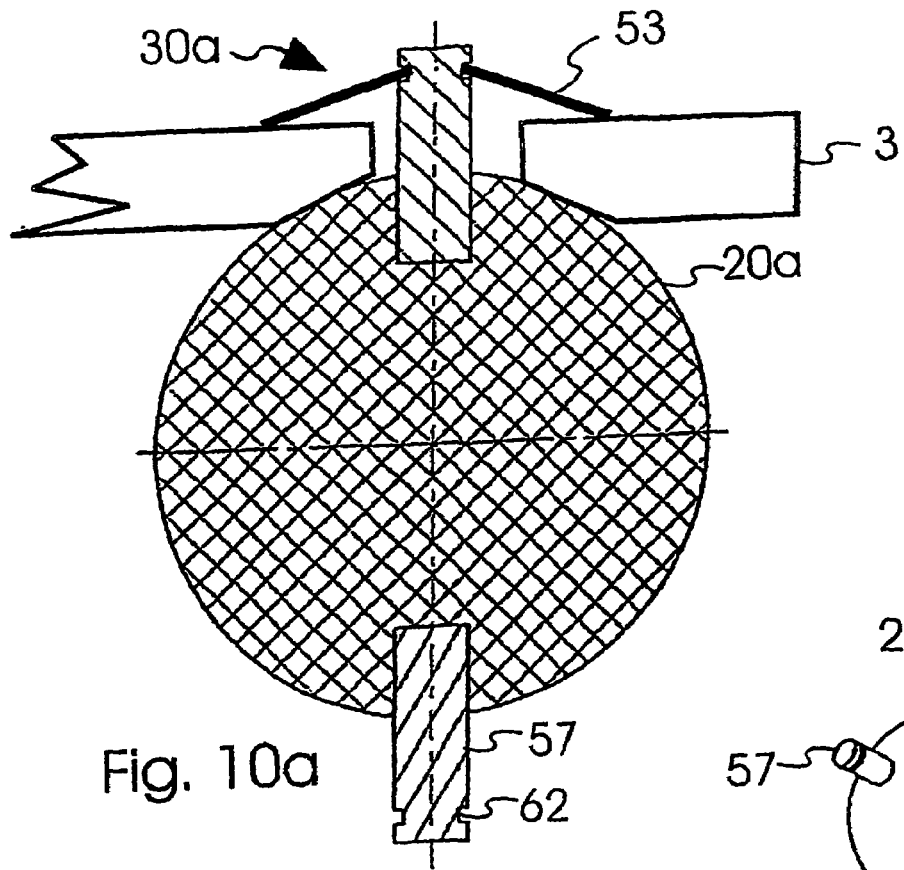
FIGS. 10a-c Different views on a spherically shaped distance piece attached to a first element as disclosed by the present invention FIG. 11 Detailed view on a beam optical component depicting the holding pieces for holding three electrodes or pole pieces according to the invention in position FIGS. 12a-b Beam optical component according to the invention with two pole pieces aligned to focus a charged particle beam by means of a magnetic field.
Figure 10B:
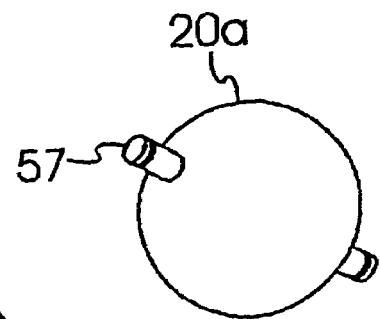
Figure 10C:
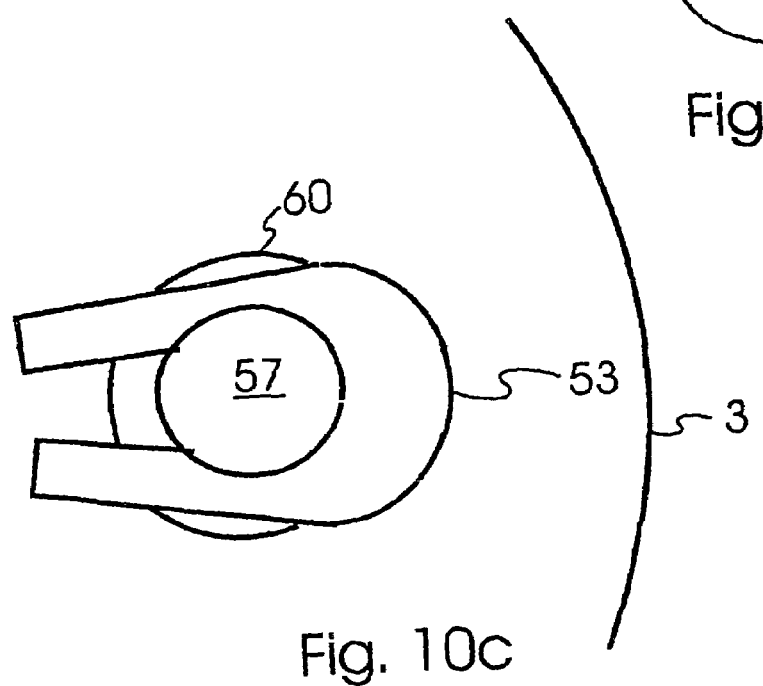

FIGS. 10a-10c disclose different views on a spherically shaped distance piece 20a with another type of holding piece according to the invention. The holding pieces of FIG. 10a-10c may be used for any of the other beam optical components described in this application.

FIG. 10a illustrates a cross section through the center of the spherically shaped distance piece 22a with two notched pins 57, i.e. a pin having a notch 62 engraved in it. The notched pins 57 are attached to spherically shaped distance piece 22a by, e.g., gluing or brazing. As can be seen from FIGS. 10a and 10c, notched pins 57 is used to abut electrode 3 to spherically shaped distance piece 20a by means of a spring 53 inserted into notch 62 under the pressure exerted by electrode 3 onto spring 53. This way, electrode 3 is pushed down onto spherically shaped distance piece 22a at a pressure that is essentially given by the type of spring. FIG. 10c depicts notched pin 57 with spring 53 in more detail when viewed in the direction of the notched pin 57.

In FIG. 10a-10c, the spherically shaped distance piece is made of $Al_2O_3$. The fabrication of spheres with a geometric precision below 1 micrometer, made out of materials like $Al_2O_3$, is well known in the art. The diameters of the spheres can be chosen quite freely. For applications in charged particle beam devices, the spheres have typically a diameter between 1 mm to 100 mm. In FIG. 10a-10c, the diameter of the sphere diameter is 15 mm. For applications in high energy beams, the diameter of the spheres may even have to exceed 100 mm in order to withstand the high voltages between the electrodes that is required by such high energy.

Spherically shaped distance pieces of the kind as shown in FIGS. 10a-10c may also be fabricated from materials other then $Al_2O_3$, under the conditions that (a) the material is electrically insulating, (b) the material can be shaped to a sphere with a high geometric precision and (c) the material is hard enough to withstand the pressure exerted by art electrode that is pressed onto the sphere by a respective holding piece. For example, the spherically shaped distance piece may be made of materials like insulating ceramics, glass, sapphire etc.

The notched pins 51 in FIG. 10a-10c are made of, e.g. stainless steel or, for brazing the pins into a spherically shaped distance piece, titan or vacon. However, other electrically conducting or non-conducting materials can be used as well. In FIG. 10a-10c, the notched pins 51 are attached to the spherically shaped distance piece 22a by gluing. To do this, two holes are drilled into the spherically shaped distance piece 22a on opposite sides along a same axis of the sphere. Then, the two notched pins 51 are each inserted into the respective holes after some glue has been filled into the holes.

Notches 62 on the other end of the notched pins 57 serve to hold springs 53 in position to exert a well-defined force onto an electrode for abutting the electrode onto the spherically shaped distance piece 22a. With a spring 53 as shown in FIG. 10a and 10c, the force exerted by a holding piece onto an electrode depends essentially on the type of spring. The holding piece design of FIG. 10a-10c differs from the design of FIGS. 5-6 in that it does not require a nut 52 for holding the spring. It is therefore easy to install in place.

Again, notched pins 57 according to the invention do not necessarily have to be of the type as shown in FIG. 10a-10c. The pins 51, instead, may have threads to be screwed into the respective spherically shaped distance pieces. It is clear that a person skilled in the art will know of many other ways in which holding pieces can be formed to abut an electrode to its respective distance piece, whereby the holding piece is attached to distance piece.

Figure 11:
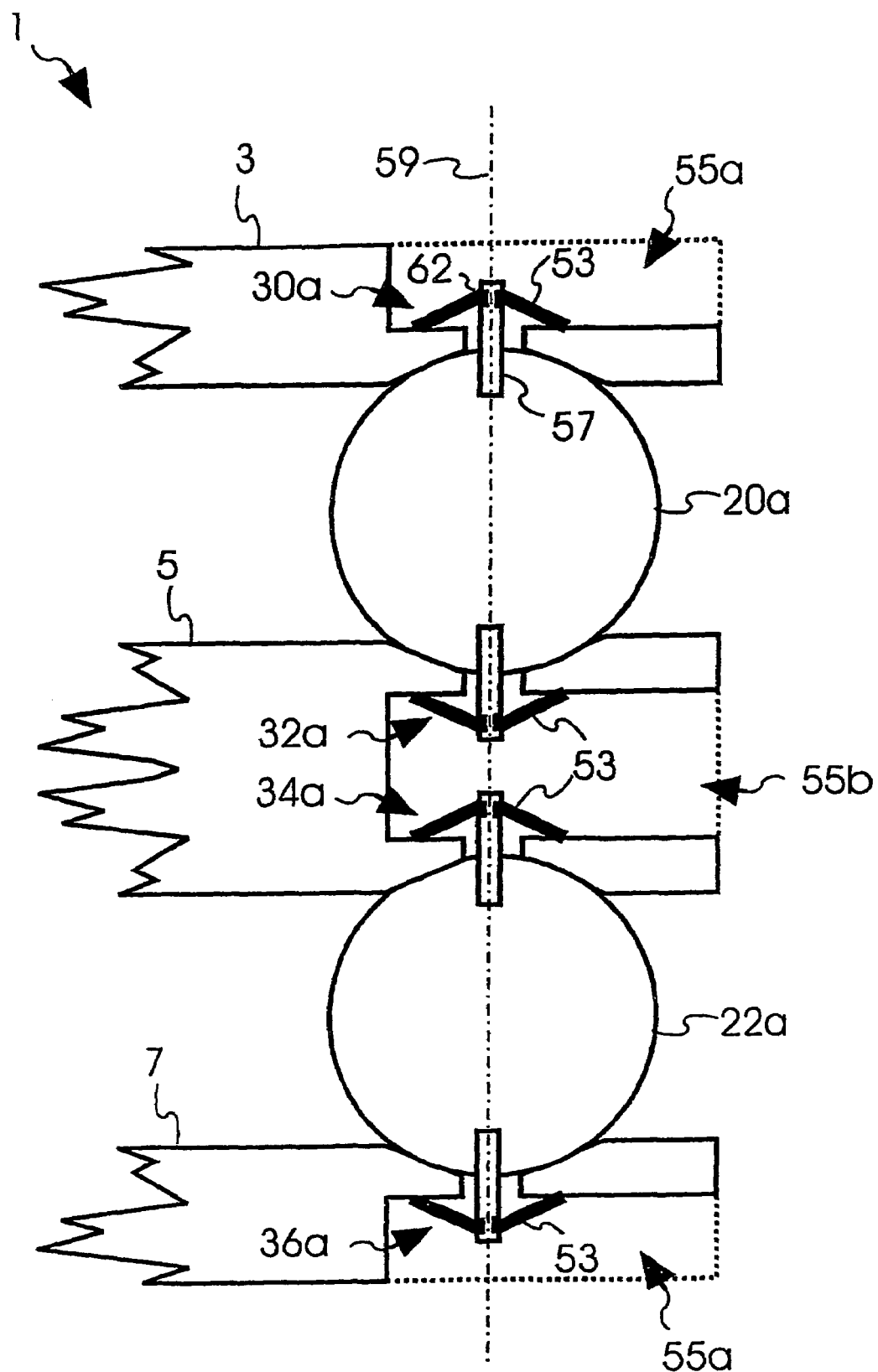

FIG. 11 discloses a further improvement of a beam optical component 1 having three electrodes 3, 5, 7. Contrary to the design in FIG. 3a, 4, or 6-8, distance piece 20a of FIG. 11 is positioned on top of further distance piece 22a along a common distance piece axis 59. This design is possible due to holding pieces that do not require recess openings 40a, 42a in the respective adjacent electrodes to access the holding pieces (see FIG. 3a, 4, or 6-8). In FIG. 11, holding pieces 30a, 32a, 34a, 36a are of the notched pin 57 type which can be assembled by sliding spring 53 onto notched pin 62 from the side (see FIG. 10c). This way, it is possible to mount or dismount second electrode 5 from the two spherically shaped distance piece 20a and 22a by sliding the respective springs 53 from the side in or out, thereby using milled recess bag 55b within second electrode 5 for access. This simplifies the design of the beam optical components. The design of FIG. 11 also improves the rotational symmetry of the beam optical components since the recess openings 40a, 40b, 40c, 42a, 42b, 42c of FIG. 3a, 4, or 6-8 can be omitted. A good rotational symmetry is important for a good focussing quality of electrostatic lenses.

Note that FIG. 11 also discloses open recesses 55a within first electrode 3 and third electrode 7 to sink the corresponding holding pieces 30a, 36a as well. This, as in FIG. 9, helps to minimize electric field peaks that may be a reason for arcing when high voltages are applied.

Figure 12A:
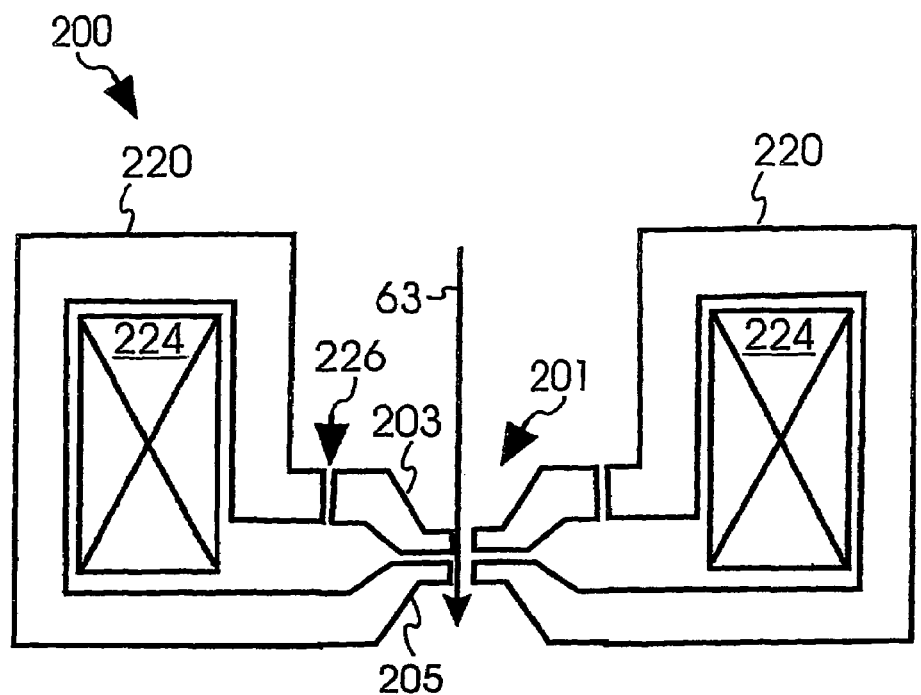
Figure 12B:
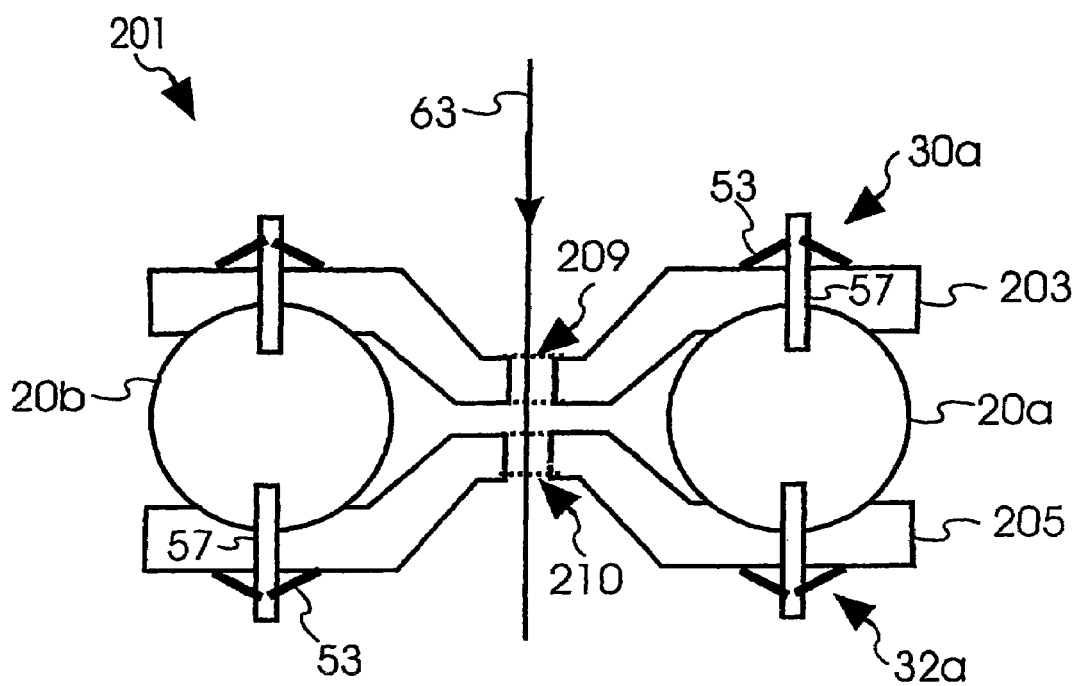

FIGS. 12a-12b disclose a beam optical component 201 according to the invention that uses a magnetic field for focussing charged particle beam 63 (magnetic lens). FIG. 12a schematically depicts the magnetic lens system including a magnetic coil 224 for providing a magnetic flux to the magnetic lens 201, while FIG. 12b depicts the magnetic lens 201 of the magnetic lens system alone. Magnetic lens 201 of FIG. 12b comprises rotationally symmetric first and second pole pieces 203, 205 (first and second elements) having respective first and second openings 209, 210 to provide for a focussing magnetic field in the region where charged particle beam 63 passes through the openings. The quality of the focussing strongly depends on the ability to coaxially align first and second openings 209, 210 within a micrometer range. As for the electrode systems described in the previous figures, such high alignment precision can be achieved with equal spherically shaped distance pieces 20a, 20b, 20c, first holding pieces 30a, 30b, 30c to abut first pole piece 203 to the spherically shaped distance pieces 20a, 20b, 20c, second holding pieces 32a, 32b, 32c to abut second pole piece 205 to the spherically shaped distance pieces 20a, 20b, 20c, and recesses 56 (see FIG. 2c) in the pole pieces 203, 205 to receive the respective distance pieces 20a, 20b, 20c therein. The holding pieces can be the same as for the electrode systems; in FIG. 12b, the holding pieces are each comprised of a notched pin 57 and spring 53 as described in FIGS. 10a-10c.

FIG. 12a illustrates the way in which magnetic flux is provided to the magnetic focussing lens 201. In FIG. 12a, a magnetic coil 223 is shown which is rotationally symmetric with respect to the optical axis of the focussing lens, which in FIG. 12a-b is represented by the charged particle beam 63. Coil 224 is further surrounded by yoke 220 which transports the magnetic flux of the magnetic coil 223 to the magnetic focussing lens 201. Second pole piece 205 in FIG. 12a is integrated into yoke 220 in order to maximize the magnetic flux at opening 210. First pole piece 203, in contrast, is separated from yoke 220 by a thin air slit 226 in order to provide clearance for the alignment of first pole piece 203 to second pole piece 205.

The magnetic focussing lens of FIGS. 12a-12b is only a specific non-limiting embodiment to describe one of many ways in which a beam optical component can act on a charged particle beam by using a magnetic field. A skilled person will also know how pole pieces can be used for deflectors, spectrometers and the like. He will also know from the present description how to use the holding pieces and distance pieces of the present invention for other magnetic beam optical component applications.

The invention claimed is:

1. A beam optical component for acting on a charged particle beam, comprising:
   a first element having a first opening for acting on said charged particle beam;
   at least one second element for acting on said charged particle beam;
   a first distance piece positioned between said first element and said at least one second element to provide for a minimum distance between said first element and said second element; and
   a first holding piece for abutting said first element to said first distance piece, wherein said first holding piece is directly attached to said first distance piece.

2. The beam optical component of claim 1, further comprising a second holding piece for abutting said second element to the first distance piece, wherein said second holding piece is directly attached to said first distance piece.

3. The beam optical component of claim 1, wherein the at least one second element has a first structured portion to be aligned to said first opening.

4. The beam optical component of claim 3, wherein the first structured portion comprises a second opening to act on the charged particle beam.

5. The beam optical component of claim 1, further comprising a third element having a second structured portion to be aligned to the first opening.

6. The beam optical component of claim 5, wherein the second structured portion comprises a third opening to act on the charged particle beam.

7. The beam optical component of claim 1, wherein the first, second or third elements are respective first, second or third electrodes.

8. The beam optical component of claim 1, wherein the first, second or third elements are respective first, second or third pole pieces.

9. A charged particle beam device comprising a beam optical component, the beam optical component comprising:
   a first element having a first opening for acting on said charged particle beam;
   at least one second element for acting on said charged particle beam;
   a first distance piece positioned between said first element and said at least one second element to provide for a minimum distance between said first element and said second element; and
   a first holding piece for abutting said first element to said first distance piece, wherein said first holding piece is directly attached to said first distance piece.

10. The beam optical component of claim 1, wherein the first holding piece is attached to the first distance piece to abut the first element to the first distance piece.

11. A beam optical component for acting on a charged particle beam, comprising:
    a first element having a first opening for acting on said charged particle beam;
    at least one second element for acting on said charged particle beam;
    a first distance piece positioned between said first element and said at least one second element to provide for a minimum distance between said first element and said second element;
    a first holding piece for abutting said first element to said first distance piece, wherein said first holding piece is directly attached to said first distance piece;
    at least one third element having a second structured portion to be aligned to the first opening; and a second distance piece to define a minimum distance between the second element and the third element.

12. The beam optical component of claim 11, comprising a second holding piece for abutting the second element to the first distance piece and a third holding piece for abutting the second element to the second distance piece.

13. The beam optical component of claim 12, comprising a fourth holding piece for abutting the third element to the second distance piece.

14. The beam optical component of claim 13, wherein the first distance piece or the second distance piece are three distance pieces.

15. The beam optical component of claim 13, wherein the first distance piece or the second distance piece are spherically shaped.

16. The beam optical component of claim 13, wherein the first distance piece or the second distance piece are spherically shaped bodies having at least one waist to reduce the lateral extension of the sphere.

17. The beam optical component of claim 12, wherein the first, second or third holding piece comprises a pin, a holding screw, a setscrew or a notched pin inserted into the respective distance piece for the direct attachment of the first, second or third holding piece to the respective distance piece.

18. The beam optical component of claim 12, wherein the first, second or third holding piece comprises respective nuts for abutting the respective element to the respective distance piece.

19. The beam optical component of claim 12, wherein the first, second or third holding piece comprises springs for abutting the respective first, second or third element to the first or the second distance piece at predetermined pressures.

20. The beam optical component of claim 1, wherein each of the first and second elements comprises a recess adapted for receiving the first distance piece therein.

* * * * *

UNITED STATES PATENT AND TRADEMARK OFFICE
CERTIFICATE OF CORRECTION

| | | |
|---|---|---|
| PATENT NO. | : 7,675,042 B2 | Page 1 of 1 |
| APPLICATION NO. | : 10/578206 | |
| DATED | : March 9, 2010 | |
| INVENTOR(S) | : Frosien | |

It is certified that error appears in the above-identified patent and that said Letters Patent is hereby corrected as shown below:

In the Description of the Preferred Embodiments:

Column 12, Line 30, please delete "art" and insert --an-- therefor.

Signed and Sealed this

First Day of June, 2010

David J. Kappos
*Director of the United States Patent and Trademark Office*